(12) United States Patent
Nolan

(10) Patent No.: US 9,343,273 B2
(45) Date of Patent: May 17, 2016

(54) SUBSTRATE HOLDERS FOR UNIFORM REACTIVE SPUTTERING

(75) Inventor: Thomas Nolan, Fremont, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 2144 days.

(21) Appl. No.: 12/238,279

(22) Filed: Sep. 25, 2008

(65) Prior Publication Data

US 2010/0072056 A1 Mar. 25, 2010

(51) Int. Cl.
C23C 14/00 (2006.01)
C25B 11/00 (2006.01)
C25B 13/00 (2006.01)
H01J 37/32 (2006.01)
C23C 14/50 (2006.01)

(52) U.S. Cl.
CPC ........... *H01J 37/32715* (2013.01); *C23C 14/50* (2013.01); *Y10T 29/49826* (2015.01)

(58) Field of Classification Search
CPC .................................................. H01J 37/32715
USPC .......................................... 204/298.15, 192.1
See application file for complete search history.

(56) References Cited

U.S. PATENT DOCUMENTS

| | | |
|---|---|---|
| 4,243,472 A | 1/1981 | O'Neill |
| 4,354,453 A | 10/1982 | Koike et al. |
| 4,849,066 A | 7/1989 | Deal et al. |
| 4,930,854 A | 6/1990 | Albares et al. |
| 5,078,851 A | 1/1992 | Nishihata et al. |
| 5,147,520 A | 9/1992 | Bobbio |
| 5,228,968 A | 7/1993 | Zejda et al. |
| 5,296,091 A | 3/1994 | Bartha et al. |
| 5,304,278 A | 4/1994 | Bartha et al. |
| 5,334,250 A | 8/1994 | Mikami et al. |
| 5,397,396 A | 3/1995 | Kosky et al. |
| 5,740,488 A | 4/1998 | Fujimoto et al. |
| 5,800,688 A | 9/1998 | Lantsman et al. |
| 5,922,126 A | 7/1999 | Furukawa et al. |
| 5,948,215 A | 9/1999 | Lantsman |
| 6,077,406 A | 6/2000 | Kawakubo et al. |
| 6,338,775 B1 | 1/2002 | Chen |
| 6,347,601 B1 | 2/2002 | Hosoi et al. |
| 6,398,926 B1 | 6/2002 | Mahneke et al. |
| 6,416,635 B1 | 7/2002 | Hurwitt et al. |
| 6,508,883 B1 | 1/2003 | Tanguay |
| 6,620,623 B1 | 9/2003 | Yershov et al. |
| 6,623,606 B2 | 9/2003 | Hurwitt et al. |
| 6,682,396 B1 | 1/2004 | Shih et al. |
| 6,702,898 B2 | 3/2004 | Hosoi et al. |

(Continued)

FOREIGN PATENT DOCUMENTS

JP 06264237 A * 9/1994 ............... C23C 14/50
WO WO 2006013908 A1 * 2/2006 ..................... 360/110

OTHER PUBLICATIONS

Machine Translation of JP06-264237A.*

*Primary Examiner* — Ibrahime A Abraham
(74) *Attorney, Agent, or Firm* — Hall Estill Attorneys at Law

(57) ABSTRACT

A substrate holder for a substrate including a frame body having an opening for the placement of the substrate. The frame body also includes a hollow portion therein. The substrate holder may be used in a sputtering apparatus for sputtering material onto the substrate. The substrate holder is particularly advantageous in the manufacturing of magnetic recording medium.

20 Claims, 6 Drawing Sheets

Embodiment of a Substrate holder.

(56) References Cited

U.S. PATENT DOCUMENTS

| | | |
|---|---|---|
| 6,709,523 B1 | 3/2004 | Toshima et al. |
| 6,746,310 B2 | 6/2004 | Tricard et al. |
| 2001/0010256 A1* | 8/2001 | Nozawa et al. ............... 156/345 |
| 2003/0133762 A1* | 7/2003 | Yamamoto et al. ........... 406/198 |
| 2003/0159919 A1* | 8/2003 | Fairbairn et al. ........... 204/192.2 |
| 2004/0115387 A1* | 6/2004 | Yi ................................. 118/721 |

* cited by examiner

Figure 1. Schematic View of a Magnetic Disk Drive.
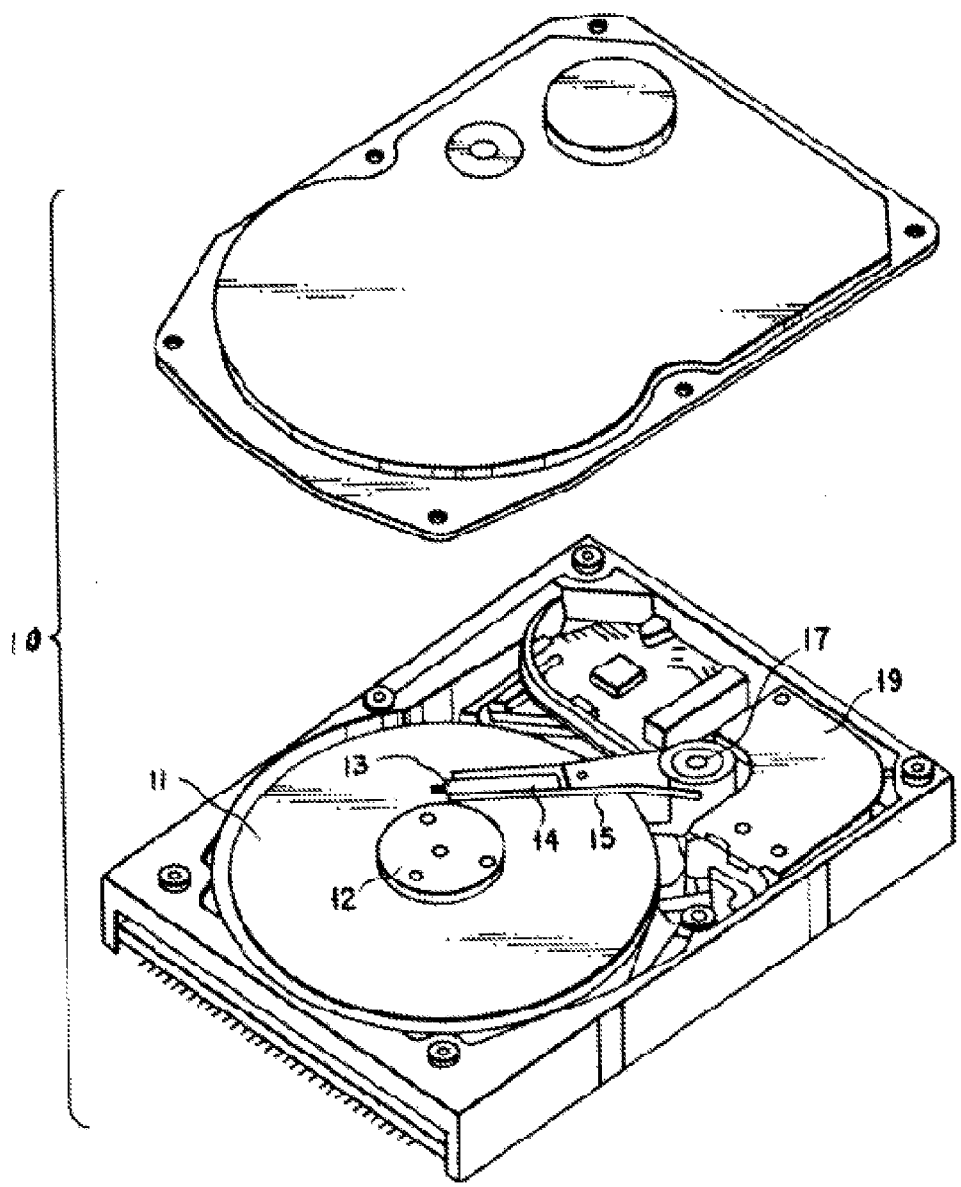

Figure 2. Schematic Representation of the Film Structure in Accordance With a Magnetic Recording Medium.
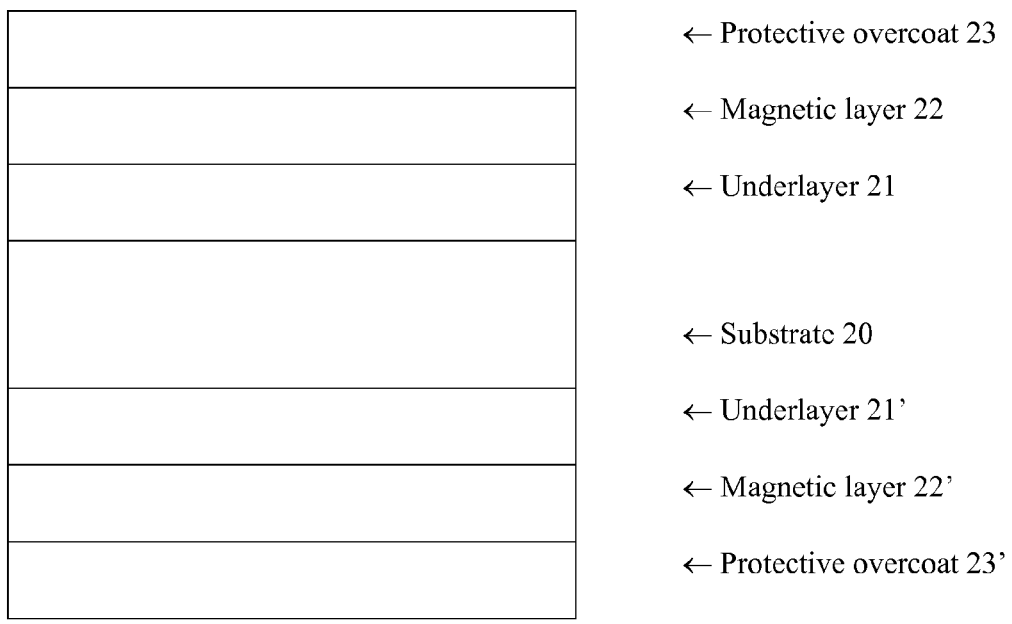
← Protective overcoat 23
← Magnetic layer 22
← Underlayer 21
← Substrate 20
← Underlayer 21'
← Magnetic layer 22'
← Protective overcoat 23'

Figure 3. Perspective View of a Magnetic Head and a Magnetic Disk.
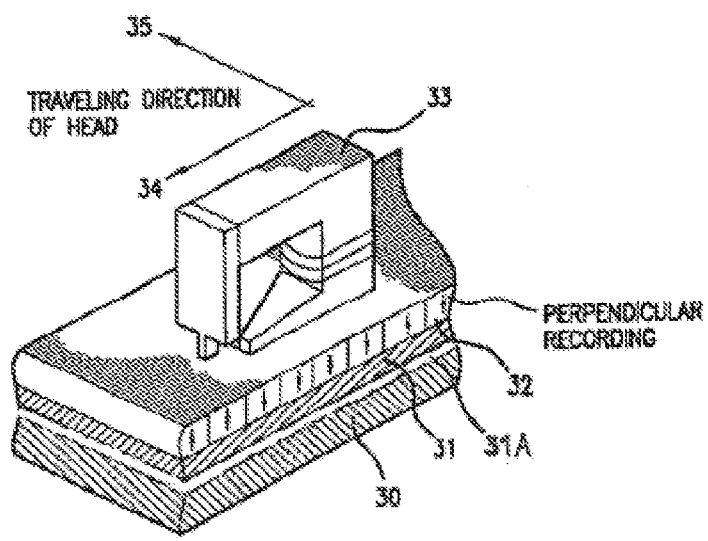

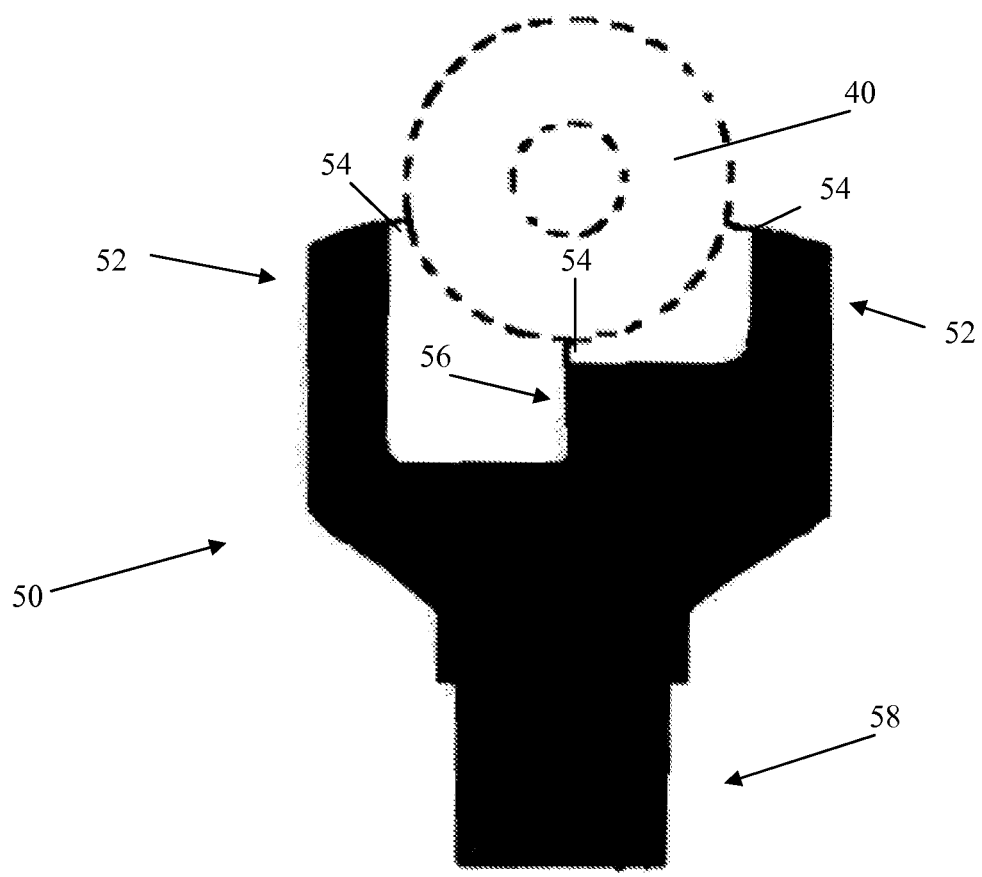
Figure 4. Substrate holder

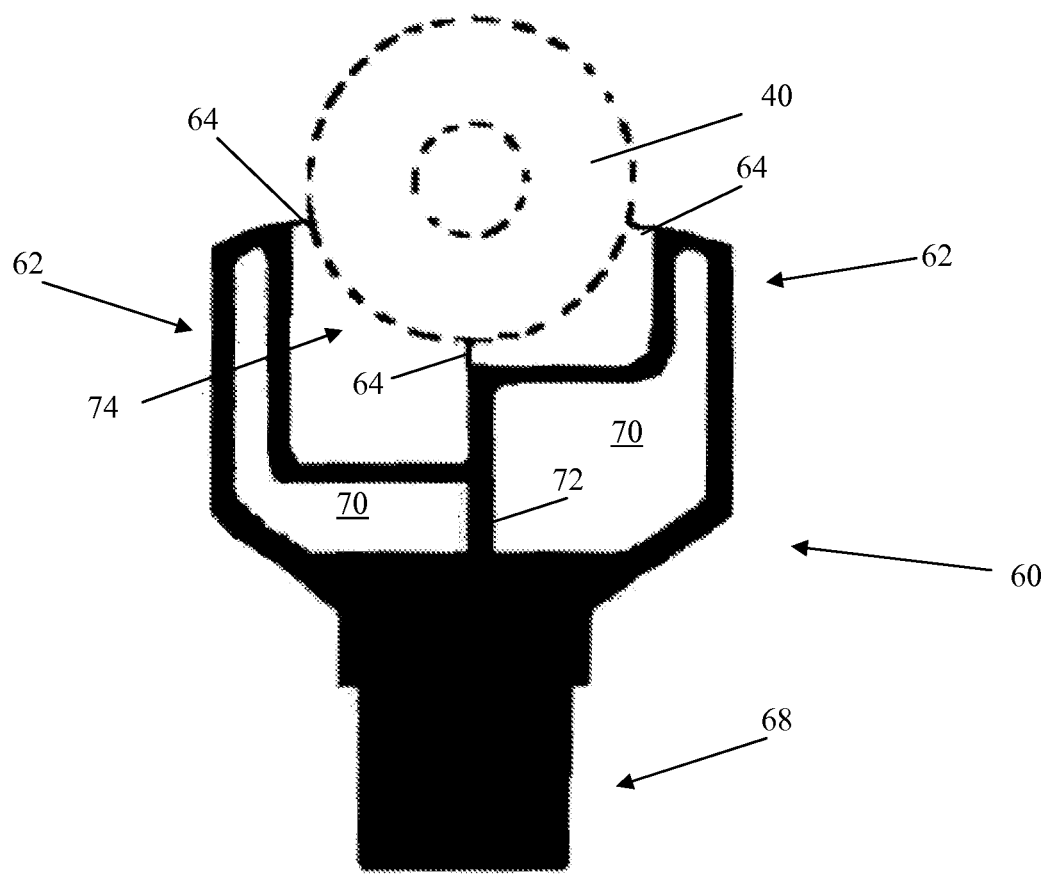
Figure 5. Embodiment of a Substrate holder.

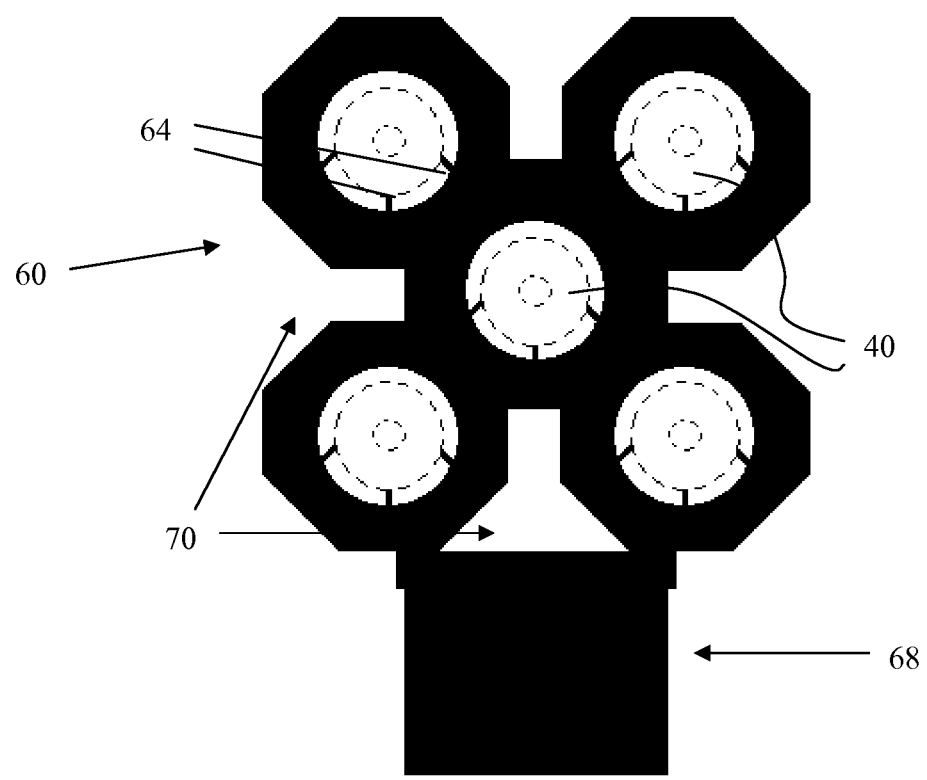
Fig. 6 Another Embodiment of a Substrate Holder

SUBSTRATE HOLDERS FOR UNIFORM REACTIVE SPUTTERING

BACKGROUND

The increasing demands for higher areal recording density impose increasingly greater demands on thin film magnetic recording media in terms of coercivity (Hc); magnetic remanance (Mr); coercivity squareness (S*); medium noise, eg., signal-to-medium noise ratio (SMNR); and narrow track recording performance. It is extremely difficult to produce a magnetic recording medium satisfying such demanding requirements.

The linear recording density can be increased by decreasing the medium noise, as by maintaining very fine magnetically decoupled grains in the magnetic layer of the magnetic medium. Medium noise is a dominant factor restricting increased recording density of high-density magnetic hard disk drives, and is attributed primarily to inhomogeneous grain size and intergranular exchange coupling in the magnetic layer. Accordingly, in order to increase linear density, medium noise must be minimized by suitable microstructure control of the magnetic layer and other layers of the magnetic medium.

The microstructure of the magnetic layer and others layers of the magnetic medium is determined by both the composition of the layers as well as the conditions for reactive sputtering for depositing the layers on the medium. One challenge associated with reactive sputtering is that it is difficult to produce uniform compositions across the substrate surface. Much of the reactive gas is consumed as it passes over reactive surfaces in the sputtering chamber. These surfaces may include the chamber walls, the substrate surface and the substrate holders. Depending on the distribution of material around the substrate surface, the consumption of reactive gases around the substrate can result in non-uniformity of the layers sputtered on the substrate. Due to the close proximity of the substrate holder to the substrate, the holder may have particularly harmful effects on the uniformity of the layer sputtered on the substrate surface.

SUMMARY OF THE INVENTION

The embodiments of the invention relate to a holder for a substrate, the holder comprising a frame body; at least one opening in the frame body operable to hold a substrate; and at least one hollow section within the frame, wherein the at least one hollow section is operable to reduce consumption of reactive gas in a reactive sputtering chamber.

As will be realized, this invention is capable of other and different embodiments, and its details are capable of modifications in various obvious respects, all without departing from this invention. Accordingly, the drawings and description are to be regarded as illustrative in nature and not as restrictive. These and various other features and advantages will be apparent from a reading of the following detailed description.

BRIEF DESCRIPTION OF THE DRAWINGS

FIG. 1 is a view of a magnetic disk drive.

FIG. 2 is a schematic representation of the film structure in accordance with a magnetic recording medium.

FIG. 3 is a perspective view of a magnetic head and a magnetic disk.

FIG. 4 shows a substrate holder.

FIG. 5 shows an embodiment of a substrate holder.

FIG. 6 shows another embodiment of a substrate holder.

DETAILED DESCRIPTION

The invention provides a substrate holder with a profile that reduces the amount of reactive gas consumed in the sputtering chamber, particularly in the vicinity of the substrate.

This invention relates to a substrate holder with a reduced surface area. The invention has particular applicability to the production of recording media, such as thin film magnetic recording disks.

In one embodiment, the invention provides a substrate holder. The holder can be used for media substrates, silicon substrates or other substrates. Additionally, the substrates may be circular, square or other desired shapes. The holder includes a frame body to hold the substrate as material is sputtered onto the substrate. The frame body is shaped with an opening for the placement of the substrate therein. Further, the frame body includes a hollow portion that is adapted to reduce the consumption of reactive gas in the reactive sputtering chamber.

In another embodiment, the invention provides a method of forming a substrate holder. The method includes providing a frame body with an opening that is adapted to hold a substrate as material is sputtered thereon. The method also includes hollowing out a portion of the substrate holder in order to reduce the consumption of reactive gas in the reactive sputtering chamber.

In still another embodiment, the invention provides a method of reactive sputtering. The method includes providing a sputtering chamber with a sputtering cathode inside. A substrate holder with a substrate therein is placed in the sputtering chamber and material is sputtered onto a surface of the substrate. The substrate holder includes a frame body, at least one opening where the substrate is placed, and a hollow section within the frame body.

According to the domain theory, a magnetic material is composed of a number of submicroscopic regions called domains. Each domain contains parallel atomic magnetic moments and is thus always magnetized to saturation, but the directions of magnetization of different domains are not necessarily parallel. In the absence of an applied magnetic field, adjacent domains may be oriented randomly in any number of several directions, called the directions of easy magnetization, which depend on the geometry of the crystal. The resultant effect of all these various directions of magnetization may be zero, as is the case with an unmagnetized specimen. When a magnetic filed is applied, the domains most nearly parallel to the direction of the applied field grow in size at the expense of the others. This is called boundary displacement of the domains or domain growth. A further increase in magnetic field causes more domains to rotate and align parallel to the applied field. When the material reaches the point of saturation magnetization, no further domain growth would take place on increasing the strength of the magnetic field.

A magnetic material is said to possess a uniaxial anisotropy when it includes only one magnetic easy axis. On the other extreme, a magnetic material is said to be isotropic when no domain orientation is favored.

The ease of magnetization or demagnetization of a magnetic material depends on the crystal structure, grain orientation, the state of strain, and the direction and strength of the magnetic field. The magnetization is most easily obtained along the easy axis of magnetization but most difficult along the hard axis of magnetization.

"Anisotropy energy" is the difference in energy of magnetization for these two extreme directions, namely, the easy axis of magnetization and the hard axis of magnetization. For example, a single crystal of iron, which is made up of a cubic array of iron atoms, tends to magnetize in the directions of the cube edges along which lie the easy axes of magnetization. A single crystal of iron requires about $1.4 \times 10^5$ ergs/cm$^3$ (at room temperature) to move magnetization into the hard axis of magnetization, which is along a cubic body diagonal.

The anisotropy energy $U_A$ could be expressed in an ascending power series of the direction cosines between the magnetization and the crystal axes. For cubic crystals, the lowest-order terms take the form of Equation (1), $$U_A = K_1(\alpha_1^2\alpha_2^2 + \alpha_2^2\alpha_3^2 + \alpha_3^2\alpha_1^2) + K_2(\alpha_1^2\alpha_2^2\alpha_3^2) \tag{1}$$

where $\alpha_1$, $\alpha_2$ and $\alpha_3$ are direction cosines with respect to the cube, and $K_1$ and $K_2$ are temperature-dependent parameters characteristic of the material, called anisotropy constants.

Anisotropy constants can be determined from (1) analysis of magnetization curves, (2) the torque on single crystals in a large applied field, and (3) single crystal magnetic resonance.

The total energy of a magnetic substance depends upon the state of strain in the magnetic material and the direction of magnetization including three contributions. Two consist of the crystalline anisotropy energy of the unstrained lattice and a correction that takes into account the dependence of the anisotropy energy on the state of strain. A third contribution is that of the elastic energy, which is independent of magnetization direction and is a minimum in the unstrained state. The state of strain of the crystal will be that which minimizes the sum of the energy contributions. The result is that, when magnetized, the lattice is distorted from the unstrained state, unless there is no magnetostriction.

"Magnetostriction" refers to the changes in dimension of a magnetic material when it is placed in magnetic field. It is caused by the rotation of domains of a magnetic material under the action of magnetic field. The rotation of domains gives rise to internal strains in the material, causing its contraction or expansion.

The requirements for high areal density impose increasingly greater requirements on magnetic recording media in terms of coercivity (Hc); magnetic remanance (Mr); coercivity squareness (S*); medium noise, eg., signal-to-medium noise ratio (SMNR); and narrow track recording performance. It is extremely difficult to produce a magnetic recording medium satisfying such demanding requirements, particularly a high-density magnetic rigid disk medium for longitudinal or perpendicular recording. The magnetic anisotropy of longitudinal and perpendicular recording media makes the easily magnetized direction of the media located in the film plane and perpendicular to the film plane, respectively. The remanent magnetic moment of the magnetic media after magnetic recording or writing of longitudinal and perpendicular media is located in the film plane and perpendicular to the film plane, respectively.

Almost all the manufacturing of a disk media takes place in clean rooms where the amount of dust in the atmosphere is kept very low, and is strictly controlled and monitored. After one or more cleaning processes, the substrate has an ultra-clean surface and is ready for the deposition of layers of magnetic media on the substrate. The apparatus for depositing all the layers needed for such media could be a static sputter system or a pass-by system, where all the layers except the lubricant are commonly deposited sequentially inside a suitable vacuum environment.

A substrate material preferably employed in producing magnetic recording rigid disks comprises an aluminum-magnesium (Al—Mg) alloy. Such Al—Mg alloys are typically electrolessly plated with a layer of NiP at a thickness of about 5-15 microns to increase the hardness of the substrates, thereby providing a suitable surface for polishing to provide the requisite surface roughness or texture.

Other substrate materials have been employed, such as glass, e.g., an amorphous glass, glass-ceramic material which comprises a mixture of amorphous and crystalline materials, and ceramic materials. Glass-ceramic materials do not normally exhibit a crystalline surface. Glasses and glass-ceramics generally exhibit high resistance to shocks.

FIG. 1 shows the schematic arrangement of a magnetic disk drive 10 using a rotary actuator. A disk or medium 11 is mounted on a spindle 12 and rotated at a predetermined speed. The rotary actuator comprises an arm 15 to which is coupled a suspension 14. A magnetic head 13 is mounted at the distal end of the suspension 14. The magnetic head 13 is brought into near-contact with the recording/reproduction surface of the disk 11. The rotary actuator could have several suspensions and multiple magnetic heads to allow for simultaneous recording and reproduction on and from both surfaces of each medium.

An electromagnetic converting portion (not shown) for recording/reproducing information is mounted on the magnetic head 13. The arm 15 has a bobbin portion for holding a driving coil (not shown). A voice coil motor 19 as a kind of linear motor is provided to the other end of the arm 15. The voice motor 19 has the driving coil wound on the bobbin portion of the arm 15 and a magnetic circuit (not shown). The magnetic circuit comprises a permanent magnet and a counter yoke. The magnetic circuit opposes the driving coil to sandwich it. The arm 15 is swingably supported by ball bearings (not shown) provided at the upper and lower portions of a pivot portion 17. The ball bearings provided around the pivot portion 17 are held by a carriage portion (not shown).

A magnetic head support mechanism is controlled by a positioning servo driving system. The positioning servo driving system comprises a feedback control circuit having a head position detection sensor (not shown), a power supply (not shown), and a controller (not shown). When a signal is supplied from the controller to the respective power supplies based on the detection result of the position of the magnetic head 13, the driving coil of the voice coil motor 19 and the piezoelectric element (not shown) of the head portion are driven.

A cross sectional view of a longitudinal recording disk medium is depicted in FIG. 2. A longitudinal recording medium typically comprises a non-magnetic substrate 20 having sequentially deposited on each side thereof an underlayer 21, 21', such as chromium (Cr) or Cr-alloy, a magnetic layer 22, 22', typically comprising a cobalt (Co)-alloy, and a protective overcoat 23, 23', typically containing carbon. Practices also comprise bonding a lubricant topcoat (not shown) to the protective overcoat. Underlayer 21, 21', magnetic layer 22, 22', and protective overcoat 23, 23', are typically deposited by sputtering techniques. The Co-alloy magnetic layer deposited by sputtering techniques normally comprises polycrystallites epitaxially grown on the polycrystal Cr or Cr-alloy underlayer.

A perpendicular recording disk medium, shown in FIG. 3, is similar to the longitudinal recording medium depicted in FIG. 2, but with the following differences. First, a perpendicular recording disk medium includes a soft magnetic underlayer 31A of an alloy such as Permalloy, deposited between the substrate 30 and underlayer 31. Second, different underlayer materials (commonly an Ru-alloy) replace the Cr-alloy underlayer, to promote perpendicular anisotropy. Third, as shown in FIG. 3, magnetic layer 32 of the perpendicular recording disk medium comprises domains oriented in a direction perpendicular to the plane of the substrate 30. Also, shown in FIG. 3 are the following: (a) read-write head 33 located on the recording medium, (b) traveling direction 34 of head 33 and (c) transverse direction 35 with respect to the traveling direction 34.

The underlayer and magnetic layer are preferably sequentially sputter deposited on the substrate in an inert gas atmosphere, such as an atmosphere of pure argon. A carbon overcoat is typically deposited in argon with nitrogen, hydrogen or ethylene. Lubricant topcoats are typically about 10-15 Å thick.

A soft underlayer should preferably be made of soft magnetic materials and the recording layer should preferably include hard magnetic materials. The terms "recording layer" and "magnetic layer" are equivalent and denote the same layer. A soft underlayer is relatively thick compared to other layers. Any layers between the soft underlayer and the recording layer are called interlayer or intermediate layer. An interlayer can be made of more than one layer of non-magnetic materials. The purpose of the interlayer is to prevent an interaction between the soft magnetic underlayer and recording layer. An interlayer could also promote the desired properties of the recording layer. Longitudinal media do not have a soft magnetic underlayer. Therefore, the layers named as "underlayer," "seed layer," "sub-seed layer," or "buffer layer" of longitudinal media are somewhat equivalent to the intermediate layer(s) of perpendicular media.

It is recognized that the magnetic properties, such as Hc, Mr, S* and SMNR, which are critical to the performance of a magnetic alloy film, depend primarily upon the microstructure of the magnetic layer which, in turn, is influenced by one or more underlying layers on which it is deposited. It is also recognized that an underlayer made of soft magnetic films is useful in perpendicular recording media because it provides a return path for magnetic flux from the read-write head and amplifies a perpendicular component of the write field in the recording layer.

To produce high signal-to-noise ratio magnetic recording media, reactive sputtering is beneficial when producing the magnetic layers on the substrate surface. In the process of reactive sputtering, a reactive gas is included in the sputtering chamber along with the typical inert sputter gas (such as argon). The reactive gas combines with the target material during the sputtering process to form additional sputtered materials, such as oxides, as well as those specifically included in the target. The additional materials may segregate to the grain boundaries isolating the magnetic grains in the media. As a result of the isolated magnetic grain boundaries, higher signal to noise ratio is enabled.

A substrate holder is shown in FIG. 4. The substrate holder 50 includes an area where the substrate 40 is attached thereto. This area is bordered by solid arms 52 that partially surround the substrate 40. At an end opposite the substrate, the substrate holder is connected by a connector 58 to a pallet on which it is carried. To secure the substrate 40 to the substrate holder, edges of the substrate are tightly fixed to clips 54 on the arms 52. A third clip 54 is included on a shelf 56 that projects toward the edge of the substrate 40.

As is clear in FIG. 4, the substrate 40 is asymmetrically surrounded by the substrate holder 50 material on one side. Because the reactive gas is consumed by reaction with the substrate holder material, there is accordingly an uneven distribution of reactively sputtered grain boundary material on the surface of the substrate. Particularly, the side of the substrate near the holder includes less oxide material in the grain boundaries, resulting in non-uniform properties such as Hc, Mr, exchange coupling (Hex), and SMNR.

Thus, the inventors recognized that there is a need for a substrate holder that reduces the amount of reactive gas that is consumed by its surface. A substrate holder in accordance with the invention is shown in FIG. 5. The substrate holder includes a frame body 60 that makes up the bulk of the holder. The frame body 60 may comprise any structurally sound material, such as metal. In one portion of the substrate holder, an opening 74 is included where the substrate 40 is held. In the illustrated embodiment, the opening 74 is unbound on one side. However, it is foreseeable that the opening 74 be entirely surrounded by the substrate holder frame body 60. To reduce the amount of reactive gas that is consumed by the substrate holder, thereby increasing the amount available for sputtering, the surface area of the substrate holder is reduced by forming at least one hollow section 70 in the substrate holder.

In one embodiment of the invention, the substrate holder frame body 60 includes two arms 62 that partially extend around the substrate 40 forming the opening 74 there-between. Each arm 62 fixes one side of the substrate 40 firmly in place in the holder. As a result, the substrate 40 may be subjected to the harsh environment of a sputtering chamber without being dislodged. Specifically, each arm 62 includes a clip 64 that holds the edge of the substrate 40. Additional clips 64 may also be included that hold the substrate 40 in place. For example, as shown in FIG. 5, a third clip 64 may be included at an inner side of the opening.

The hollow section 70 in the frame body 60 is not particularly limited. However, in one embodiment the hollowed section may extend into the arms 62 of the substrate holder. To increase the structural integrity of the substrate holder, the frame body may include one or more cross beams 72 that increase its strength. The placement of the cross beam 72 may be such that it divides the hollowed area of the substrate holder into two hollowed sections 70, as shown in FIG. 5. The substrate holder may include a connector 68 at one end to be connected to a pallet.

In another embodiment, as shown in FIG. 6, the holder includes a frame body 60 with a plurality of openings 74 for a plurality of substrates 40. Each opening 74 accommodates one substrate 40. The substrates 40 are held using clips 64 similar to the above described embodiment. The frame may also include one or more hollow sections 70 to reduce the reactive surface area around the substrates 40.

The substrate holder of the invention is effective in reducing the consumption of reactive sputtering gas in the sputtering chamber, particularly in the vicinity the substrate. The use of the substrate holder is described in the following. The substrate holder of the invention may be used as part of a pallet that used in a sputtering chamber. The substrate holder may be a subsection of a pallet, or may define the pallet as a whole. In the case that the substrate holder is only a part of the pallet, it may include a connector 68 at one end to be connected to the pallet. In a sputtering process the pallet is loaded with one or more substrates and passed through a sputtering chamber. Sputtering cathodes, including sputter targets are disposed in the sputter chamber. The sputtering chamber also includes a reactive gas in order to form materials other than that of the sputter target on the surface of the substrate. As the pallet passes through the sputter chamber, layers of material are sputtered on the surface of the substrate in a substantially uniform distribution.

The above description is presented to enable a person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the invention. Thus, this invention is not intended to be limited to the embodiments shown, but is to be accorded the widest scope consistent with the principles and features disclosed herein.

As shown, the present invention advantageously provides, as by an apparatus and accompanying processing techniques which can be reliably practiced at low cost, improved methodologies and instrumentalities for forming disks to yield substrates with reliable inner and outer dimensions facilitating their use as substrates for high areal density thin film magnetic and/or MO recording media.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and technique s have not been described in detail in order not to unnecessarily obscure the present invention.

Only the preferred embodiments of the present invention and but a few examples of its versatility are shown and described in the present disclosure. It is to be understood that the present invention is capable of use in various other combinations, environments, and reactive sputtering applications, and may be changed and/or modified within the scope of the inventive concept as expressed herein. The implementations described above and other implementations are within the scope of the following claims.

I claim:

1. A holder for a substrate, the holder comprising:
    a frame body;
    an arm attached at a proximal end to the frame body and extending longitudinally therefrom, the arm at a distal end defining a thin walled hollow section within the arm formed by a peripheral wall of the arm having a substantially constant wall thickness; and
    a clip attached to the distal end of the arm that is configured for supportingly engaging the substrate.

2. The holder of claim 1 comprising a connector that connects the frame body to a transportable material handling device.

3. The holder of claim 1 wherein the arm is characterized as a first arm and the clip is characterized as a first clip, the holder further comprising:
    a second arm attached at a proximal end to the frame body and extending longitudinally therefrom, the second arm at a distal end defining a thin walled hollow section within the second arm formed by a peripheral wall of the second arm having a substantially constant wall thickness; and
    a second clip attached to the distal end of the second arm that is configured for supportingly engaging the substrate.

4. The holder of claim 3 further comprising a third clip supported by the frame body between the first and second clips and configured to supportingly engage the substrate.

5. The holder of claim 3 wherein at least one of the hollow sections defines a passage extending through the respective arm and thereby intersecting opposing longitudinal surfaces of the peripheral wall of the respective arm.

6. The holder of claim 3 wherein at least one of the thin walled hollow sections within the arm extends continuously from the distal end to the body.

7. The holder of claim 3 wherein the frame body defines a thin walled hollow section within the frame body formed by a peripheral wall of the frame body having a substantially constant wall thickness.

8. The holder of claim 6 wherein the arms are substantially coplanar and define an opening between the peripheral wall of the first arm and the peripheral wall of the second arm, the opening sized to operably receive a portion of the substrate in a plane that is substantially parallel to the coplanar arms.

9. The holder of claim 8 wherein the opening is sized to operably receive only less than half of the substrate.

10. The holder of claim 8 wherein the arms and the frame body cooperatively define the opening.

11. The holder of claim 7 wherein at least one of the first arm, the second arm, and the frame body comprise a cross beam stiffener.

12. The holder of claim 11 wherein the cross beam stiffener is substantially the same thickness as the thickness of the peripheral wall of one of the arms.

13. A holder for a substrate, the holder comprising:
    a frame body;
    a first arm attached at a proximal end to the frame body and extending longitudinally therefrom, the first arm at a distal end defining a thin walled hollow section within the arm formed by a peripheral wall of the arm having a substantially constant wall thickness;
    a different second arm attached at a proximal end to the frame body and extending longitudinally therefrom, the second arm at a distal end defining a thin walled hollow section within the second arm formed by a peripheral wall of the second arm having a substantially constant wall thickness, the peripheral wall of the first arm and the peripheral wall of the second arm defining an opening therebetween; and
    a first clip attached to the distal end of the first arm and a second clip attached to the distal end of the second arm, the clips configured for supportingly engaging the substrate.

14. The holder of claim 13 further comprising a third clip supported by the frame body between the first and second clips and configured to supportingly engage the substrate.

15. The holder of claim 13 wherein the frame body defines a thin walled hollow section within the frame body formed by a peripheral wall of the frame body having a substantially constant wall thickness.

16. The holder of claim 13 wherein the arms are substantially coplanar, the opening sized to operably receive only less than half of the substrate in a plane that is substantially parallel to the coplanar arms.

17. The holder of claim 13 wherein the arms and the frame body cooperatively define the opening.

18. The holder of claim 15 wherein at least one of the first arm, the second arm, and the frame body comprise a cross beam stiffener.

19. A method comprising:
    obtaining a holder for a substrate having a frame body and an arm attached at a proximal end to the frame body and extending longitudinally therefrom, the arm at a distal end defining a thin walled hollow section within the arm formed by a peripheral wall of the arm having a substantially constant wall thickness, and a clip attached to the distal end of the arm;
    supporting a substrate in the clip at the distal end of the arm; and
    work processing the substrate during the supporting feature.

20. The method of claim 19 comprising:
in the obtaining feature the arm is a first arm and the clip is a first clip, the holder further having a second arm attached at a proximal end to the frame body and extending longitudinally therefrom, the second arm at a distal end defining a thin walled hollow section within the arm formed by a peripheral wall of the second arm having a substantially constant wall thickness, and a second clip attached to the distal end of the second arm; and
supporting the substrate in the first clip at the distal end of the first arm and in the second clip at the distal end of the second arm.

\* \* \* \* \*